US011955906B2

United States Patent
Ito (10) Patent No.: US 11,955,906 B2
(45) Date of Patent: Apr. 9, 2024

(54) MINIATURIZATION OF CONTROL BOARDS WITH FLEXIBILITY IN DESPOSITION OF PARTS AND WIRING

(71) Applicant: AISIN CORPORATION, Aichi (JP)

(72) Inventor: Yoshinobu Ito, Kariya (JP)

(73) Assignee: AISIN CORPORATION, Kariya (JP)

( * ) Notice: Subject to any disclaimer, the term of this patent is extended or adjusted under 35 U.S.C. 154(b) by 228 days.

(21) Appl. No.: 17/637,960

(22) PCT Filed: Nov. 25, 2020

(86) PCT No.: PCT/JP2020/043850
§ 371 (c)(1),
(2) Date: Feb. 24, 2022

(87) PCT Pub. No.: WO2021/106941
PCT Pub. Date: Jun. 3, 2021

(65) Prior Publication Data
US 2022/0209685 A1    Jun. 30, 2022

(30) Foreign Application Priority Data

Nov. 25, 2019   (JP) .................................. 2019-212656

(51) Int. Cl.
*H02M 7/538*   (2007.01)
*H02M 1/44*    (2007.01)
(Continued)

(52) U.S. Cl.
CPC ......... *H02M 7/53875* (2013.01); *H02M 1/44* (2013.01); *H02M 7/003* (2013.01);
(Continued)

(58) Field of Classification Search
CPC .... H02M 7/53875; H02M 1/44; H02M 7/003; H02M 7/53871; H02M 1/0006; H02M 1/0009; H05K 1/0262; H05K 2201/09972
See application file for complete search history.

(56) References Cited

U.S. PATENT DOCUMENTS 5,444,297 A * 8/1995 Oshima ................... H01L 25/16
257/691
5,914,577 A * 6/1999 Furnival ................ H05K 1/144
310/71
(Continued)

FOREIGN PATENT DOCUMENTS

EP          3229361 A1   10/2017
JP       2012-100432 A    5/2012
(Continued)

OTHER PUBLICATIONS

Feb. 2, 2021 Search Report issued in International Patent Application No. PCT/JP2020/043850.
(Continued)

*Primary Examiner* — Yusef A Ahmed
(74) *Attorney, Agent, or Firm* — Oliff PLC (57) ABSTRACT

A board main body part has a multilayer structure with even-numbered layers including a first layer formed on a surface part on one side and a second layer formed on a surface part on the other side. On both of the first layer and the second layer, a low voltage region in which a low voltage circuit is disposed, a high voltage region in which high voltage circuits are disposed, and an insulating region in which the low voltage region is electrically isolated from the high voltage region are formed. At least a part of a first high voltage circuit is disposed in a first-layer high voltage region formed on the first layer, and at least a part of a second high (Continued)

voltage circuit is disposed in a second-layer high voltage region formed on the second layer.

3 Claims, 5 Drawing Sheets

(51) Int. Cl.
  *H02M 7/00* (2006.01)
  *H02M 7/5387* (2007.01)
  *H05K 1/02* (2006.01)
  *H02M 1/00* (2006.01)
(52) U.S. Cl.
  CPC ...... *H02M 7/53871* (2013.01); *H05K 1/0262* (2013.01); *H02M 1/0006* (2021.05); *H02M 1/0009* (2021.05); *H05K 2201/09972* (2013.01)

(56) References Cited

U.S. PATENT DOCUMENTS

| | | | | |
|---|---|---|---|---|
| 6,496,393 | B1* | 12/2002 | Patwardhan | H02M 7/003 363/70 |
| 2007/0008679 | A1* | 1/2007 | Takahasi | H01L 25/072 361/600 |
| 2008/0225487 | A1* | 9/2008 | Nakajima | H05K 7/20927 361/699 |
| 2009/0174353 | A1* | 7/2009 | Nakamura | H02M 7/003 318/400.27 |
| 2011/0199800 | A1* | 8/2011 | Yahata | B60L 3/003 363/131 |
| 2012/0063187 | A1* | 3/2012 | Sato | H02M 3/3374 363/131 |
| 2012/0119688 | A1* | 5/2012 | Hattori | H02K 11/33 361/818 |
| 2012/0248909 | A1* | 10/2012 | Ito | H02M 7/003 310/64 |
| 2012/0250384 | A1* | 10/2012 | Ito | H02K 11/33 363/132 |
| 2012/0300521 | A1* | 11/2012 | Hida | H05K 7/14329 363/131 |
| 2013/0039097 | A1* | 2/2013 | Watanabe | B60L 15/007 363/21.01 |
| 2013/0049457 | A1* | 2/2013 | Komatsu | B60L 58/22 429/10 |
| 2014/0092653 | A1* | 4/2014 | Suzuki | H03K 17/7955 363/124 |
| 2014/0345492 | A1* | 11/2014 | Fujito | B60L 15/007 105/61 |
| 2015/0060940 | A1* | 3/2015 | Muto | H01L 29/0684 257/140 |
| 2015/0078039 | A1* | 3/2015 | Miyauchi | H02M 1/08 363/21.12 |
| 2015/0084173 | A1* | 3/2015 | Zhang | H01L 23/4334 257/676 |
| 2015/0085536 | A1* | 3/2015 | Miyauchi | B60L 50/51 363/21.16 |
| 2015/0085538 | A1* | 3/2015 | Miyauchi | H02M 1/084 363/21.17 |
| 2015/0155816 | A1* | 6/2015 | Saito | H02M 1/08 318/139 |
| 2015/0236013 | A1* | 8/2015 | Yamaji | H01L 27/0922 257/296 |
| 2015/0364984 | A1* | 12/2015 | Miyauchi | H02M 7/5387 363/132 |
| 2016/0164413 | A1* | 6/2016 | Akiyama | H03K 17/165 323/271 |
| 2016/0365788 | A1* | 12/2016 | Singh | H02P 29/02 |
| 2017/0033710 | A1* | 2/2017 | Muto | H02M 7/537 |
| 2017/0279360 | A1* | 9/2017 | Mutsuura | H02M 7/003 |
| 2017/0353096 | A1* | 12/2017 | Kawaguchi | H02M 7/48 |
| 2018/0061827 | A1* | 3/2018 | Kanno | H01L 25/18 |
| 2019/0296653 | A1* | 9/2019 | Asako | H01F 27/2804 |
| 2020/0119660 | A1* | 4/2020 | Takahashi | B60L 53/122 |
| 2020/0120789 | A1* | 4/2020 | Ishikawa | H05K 7/2089 |
| 2020/0220489 | A1* | 7/2020 | Nakamura | H03K 17/78 |
| 2020/0280268 | A1* | 9/2020 | Mutsuura | H03K 17/691 |
| 2022/0254764 | A1* | 8/2022 | Sawada | H03K 17/0822 |
| 2022/0319974 | A1* | 10/2022 | Miyazaki | H01L 25/072 |
| 2023/0146272 | A1* | 5/2023 | Sato | H02K 11/33 257/691 |
| 2023/0261331 | A1* | 8/2023 | Morton | H01M 50/271 429/163 |

FOREIGN PATENT DOCUMENTS

| | | |
|---|---|---|
| JP | 2016-082110 A | 5/2016 |
| WO | 2016/88211 A1 | 6/2016 |

OTHER PUBLICATIONS

Dec. 19, 2022 Extended European Search Report Issued in European Patent Application No. 20893713.6.

* cited by examiner

MINIATURIZATION OF CONTROL BOARDS WITH FLEXIBILITY IN DESPOSITION OF PARTS AND WIRING

TECHNICAL FIELD

The present disclosure relates to a control board whose control target is an inverter.

BACKGROUND ART

An example of a control board whose control target is an inverter is disclosed in WO 2016/88211 A (Patent Literature 1). Reference signs shown in parentheses in description of BACKGROUND ART below are those of Patent Literature 1. On a substrate (11) serving as a control board of Patent Literature 1 there are provided a control circuit (CNT), drive circuits (DR1 to DR6) that drive switching elements (Q1 to Q6) in response to control signals from the control circuit (CNT), and power supply circuits (P1 to P6) that supply power to the drive circuits (DR1 to DR2). On the substrate (11), drive-circuit/power-supply-circuit placement and wiring regions (UP, UN, VP, VN, WP, and WN) of a strong electrical system in which the drive circuits (DR1 to DR6) and the power supply circuits (P1 to P6) are disposed are provided for the respective switching elements (Q1 to Q6) with insulating regions (AR11 to AR16) interposed between the drive-circuit/power-supply-circuit placement and wiring regions (UP, UN, VP, VN, WP, and WN) and the control circuit (CNT) of a weak electrical system.

As described in paragraph 0027 of Patent Literature 1, the substrate (11) of Patent Literature 1 has a three-layer wiring structure. In the substrate (11), as described in paragraphs 0027 to 0031 and FIGS. 4A to 4D of Patent Literature 1, all three wiring layers are used for each of the drive-circuit/power-supply-circuit placement and wiring regions (UP, UN, VP, VN, WP, and WN). As a result, as shown in FIG. 2 of Patent Literature 1, the plurality of drive-circuit/power-supply-circuit placement and wiring regions (UP, UN, VP, VN, WP, and WN) are disposed separately in different regions as viewed from top.

CITATIONS LIST

Patent Literature

Patent Literature 1: WO 2016/88211 A

SUMMARY OF DISCLOSURE

Technical Problems

As described above, in the control board of Patent Literature 1, a high voltage region (a drive-circuit/power-supply-circuit placement and wiring region in Patent Literature 1) for disposing a high voltage circuit connected to a switching element is provided for each switching element, and all wiring layers are used for each high voltage region. Thus, it has been difficult to dispose, in a region of each wiring layer that overlaps one high voltage region as viewed from top, a circuit or an element other than a high voltage circuit disposed in the high voltage region. As such, in the control board of Patent Literature 1, the degree of flexibility in disposition of parts and wiring has been likely to be low, and the control board has been likely to be increased in size as viewed from top.

Hence, implementation of a technique is sought that can achieve miniaturization of a control board as viewed from top by securing a high degree of flexibility in disposition of parts and wiring.

Solutions to Problems

A control board according to the present disclosure is a control board whose control target is an inverter including a first switching element and a second switching element, and the control board includes a plate-like board main body part in which a drive control circuit for performing drive control of the inverter is formed, and the drive control circuit includes a low voltage circuit; a first high voltage circuit connected to the first switching element, the first high voltage circuit being a high voltage circuit having a high operating voltage compared to the low voltage circuit; a second high voltage circuit connected to the second switching element, the second high voltage circuit being the high voltage circuit; a first transformer that supplies a drive voltage for the first switching element from the low voltage circuit to the first high voltage circuit; and a second transformer that supplies a drive voltage for the second switching element from the low voltage circuit to the second high voltage circuit, the board main body part has a multilayer structure with even-numbered layers including a first layer formed on a surface part on one side in a thickness direction of the board main body part, and a second layer formed on a surface part on an other side in the thickness direction, on both of the first layer and the second layer, a low voltage region in which the low voltage circuit is disposed, a high voltage region in which the high voltage circuits are disposed, and an insulating region in which the low voltage region is electrically isolated from the high voltage region are formed, at least a part of the first high voltage circuit is disposed in a first-layer high voltage region, the first-layer high voltage region being the high voltage region formed on the first layer, and at least a part of the second high voltage circuit is disposed in a second-layer high voltage region, the second-layer high voltage region being the high voltage region formed on the second layer.

According to this configuration, at least a part of the first high voltage circuit and at least a part of the second high voltage circuit can be disposed separately in the first-layer high voltage region and the second-layer high voltage region which are formed on the opposite surface parts of the board main body part, and thus, it becomes easy to dispose the parts and wiring included in the first high voltage circuit and the parts and wiring included in the second high voltage circuit close to each other as viewed from top, or dispose them such that they overlap each other as viewed from top. As a result, a high degree of flexibility in disposition of parts and wiring is secured, by which miniaturization of the control board as viewed from top can be achieved.

Further features and advantages of the control board will become apparent from the following description of embodiments which will be described with reference to drawings.

DESCRIPTION OF EMBODIMENTS

Figure 1:
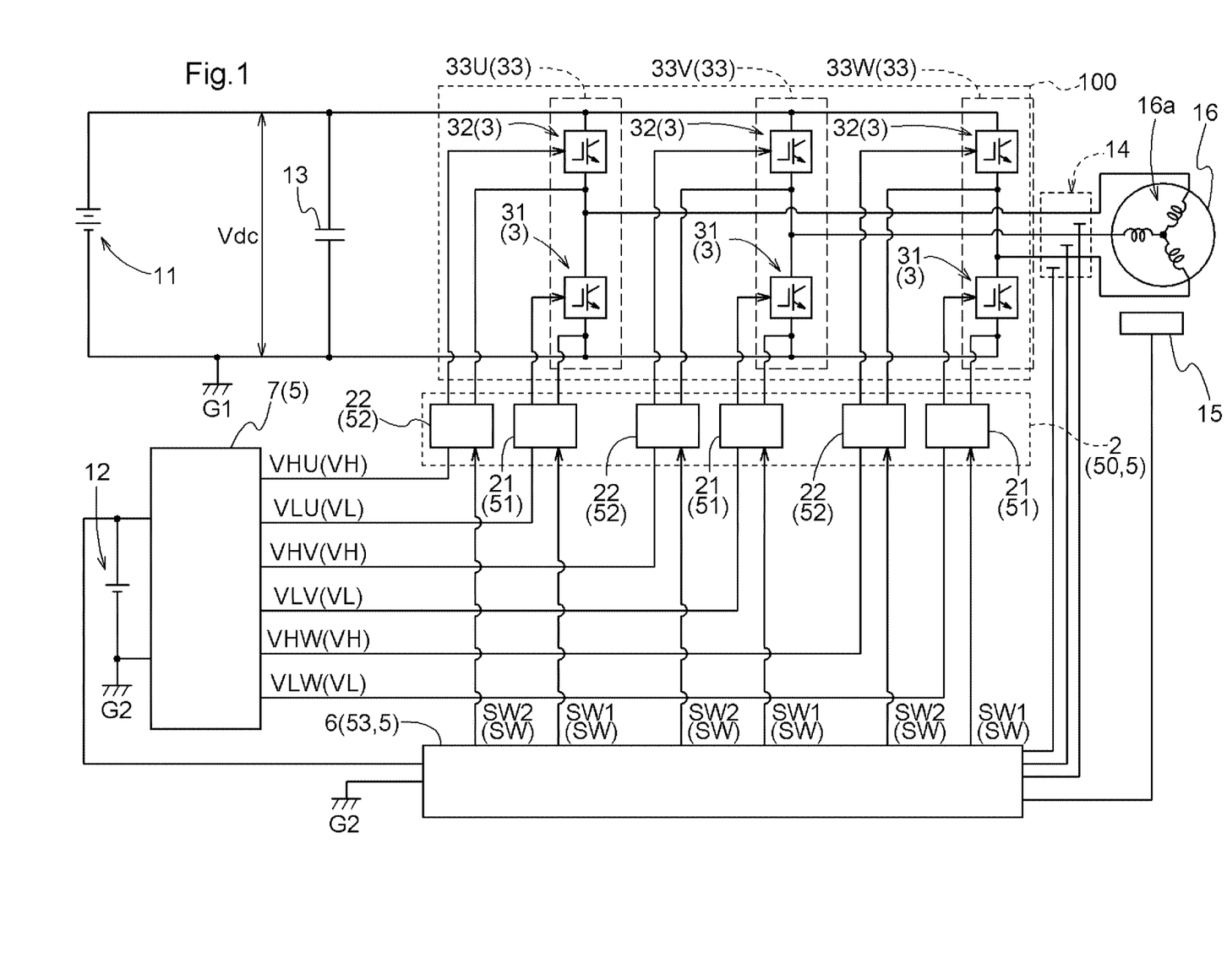
FIG. 1 is a diagram showing an exemplary configuration of an inverter which is a control target of a control board.

An embodiment of a control board will be described with reference to the drawings. A control board 1 is a board whose control target is an inverter 100 including first switching elements 31 and second switching elements 32. The inverter 100 converts electric power between direct current and alternating current, and supplies alternating current power to an alternating-current machine 16. The control board 1 controls the alternating-current machine 16 through the inverter 100. The alternating-current machine 16 is a device that operates by being supplied with alternating current power. As shown in FIG. 1, in the present embodiment, the alternating-current machine 16 is a rotating electrical machine. Specifically, the alternating-current machine 16 is a rotating electrical machine driven by alternating current power of three phases (an example of a plurality of phases) including a U-phase, a V-phase, and a W-phase, and the inverter 100 supplies three-phase alternating current power to the alternating-current machine 16 (here, stator coils 16a). The alternating-current machine 16 is, for example, a rotating electrical machine for driving wheels of a vehicle or a rotating electrical machine for driving an accessary provided in the vehicle. The accessary is a device (an additional device or an in-vehicle device) mounted on the vehicle and is, for example, a motor-driven oil pump or a compressor for an air conditioner. In this specification, the "rotating electrical machine" is used as a concept that includes all of a motor, a generator, and a motor-generator that functions as both a motor and a generator as necessary.

As shown in FIG. 1, the inverter 100 is connected to a first direct-current power supply 11 and connected to the alternating-current machine 16. The first direct-current power supply 11 supplies direct current power to a direct current side of the inverter 100. The power supply voltage of the first direct-current power supply 11 is, for example, 200 to 400 [V]. When the alternating-current machine 16 functions as a motor, the inverter 100 converts direct current power supplied from the first direct-current power supply 11 into alternating current power and supplies the alternating current power to the alternating-current machine 16. In addition, when the alternating-current machine 16 functions as a generator, the inverter 100 converts alternating current power supplied from the alternating-current machine 16 into direct current power and supplies the direct current power to the first direct-current power supply 11. A smoothing capacitor 13 that smooths out a voltage on the direct current side of the inverter 100 (direct-current link voltage Vdc) is provided between the first direct-current power supply 11 and the inverter 100. A configuration can also be adopted in which a boost circuit is provided between the first direct-current power supply 11 and the inverter 100, and the voltage of the first direct-current power supply 11 is boosted and the boosted voltage is supplied to the direct current side of the inverter 100.

Figure 7:
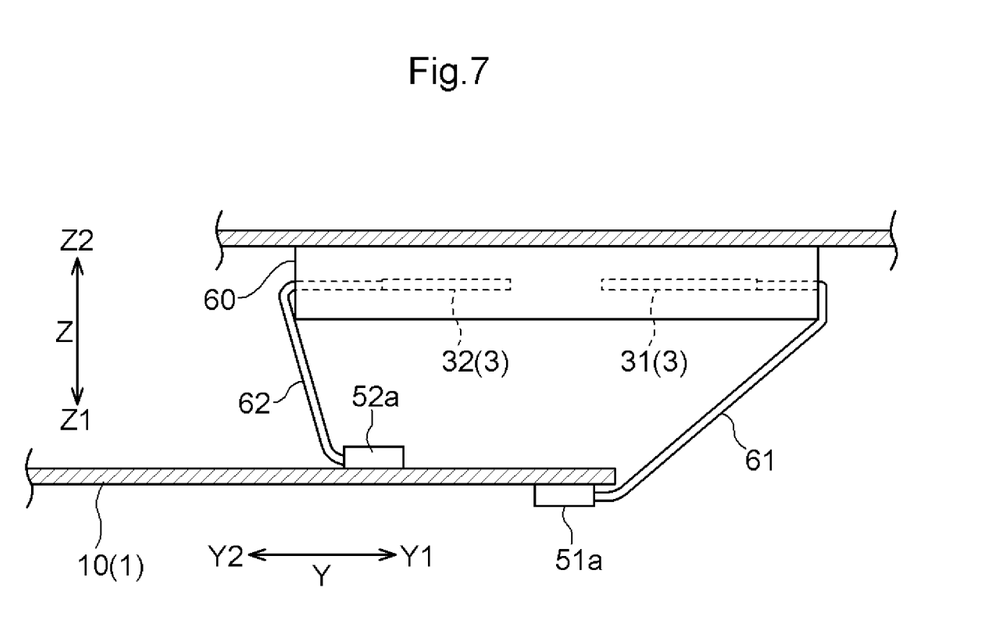
FIG. 7 is a schematic diagram showing a connection mode between the control board and switching elements according to the embodiment.

The inverter 100 includes a plurality of arms 33 each including a first switching element 31 and a second switching element 32 which are connected in series with each other. Namely, the inverter 100 includes a plurality of first switching elements 31 and a plurality of second switching elements 32. As shown in FIG. 7, in the present embodiment, the first switching elements 31 and the second switching elements 32 which are included in the inverter 100 are provided in a semiconductor device 60 such as an intelligent power module (IPM). As shown in FIG. 1, in the present embodiment, the first switching elements 31 are switching elements 3 (lower-stage-side switching elements) connected to a negative side of direct current (here, a negative side of the first direct-current power supply 11), and the second switching elements 32 are switching elements 3 (upper-stage-side switching elements) connected to a positive side of direct current (here, a positive side of the first direct-current power supply 11). Unlike such a configuration, a configuration can also be adopted in which the first switching elements 31 are upper-stage-side switching elements, and the second switching elements 32 are lower-stage-side switching elements.

The switching elements 3 included in the inverter 100 are individually subjected to switching control using switching control signals SW which will be described later. As the switching elements 3, it is preferred to use power semiconductor devices such as insulated gate bipolar transistors (IGBTs), power metal oxide semiconductor field effect transistors (MOSFETs), silicon carbide-metal oxide semiconductor FETs (SiC-MOSFETs), SiC-static induction transistors (SiC-SITs), and gallium nitride-MOSFETs (GaN-MOSFETs). FIG. 1 exemplifies a case of using IGBTs as the switching elements 3. The switching elements 3 are, for example, rectangular plate-like chip type elements. Though depiction is omitted, a freewheeling diode is connected in parallel to each of the switching elements 3. The freewheeling diode is, for example, included in a chip type element that forms the switching element 3.

The inverter 100 includes the arms 33 whose number corresponds to the number of phases of alternating current power supplied to the alternating-current machine 16. In the present embodiment, the inverter 100 includes the arms 33 whose number is equal to the number of phases of alternating current power supplied to the alternating-current machine 16. Specifically, the inverter 100 includes three arms 33, a U-phase arm 33U, a V-phase arm 33V, and a W-phase arm 33W. The plurality of arms 33 are connected in parallel to each other, forming a bridge circuit. A midpoint of each arm 33 (a connecting point between the first switching element 31 and the second switching element 32) is connected to an alternating current terminal of the alternating-current machine 16 (here, a stator coil 16a of a corresponding phase).

Control signals (switching control signals SW) for the first switching elements 31 and the second switching elements 32 are generated by a control circuit 6. The control circuit 6 generates first switching control signals SW1 that perform switching control of the first switching elements 31 and second switching control signals SW2 that perform switching control of the second switching elements 32. Namely, the control circuit 6 generates the first switching control signals SW1 and the second switching control signals SW2 as switching control signals SW. The control circuit 6 is formed using a logic circuit such as a microcomputer as a core. Each function of the control circuit 6 is implemented by, for example, cooperation of hardware such as a microcomputer and software (program).

The control circuit 6 controls the inverter 100 by generating switching control signals SW. The control circuit 6 controls the inverter 100, for example, based on an instruction from another control device (e.g., a vehicle control device that integrally controls the vehicle). The control circuit 6 controls the inverter 100, for example, by performing current feedback control that uses a vector control method, so that the alternating-current machine 16 outputs torque instructed from another control device. In an example shown in FIG. 1, currents flowing through the stator coils 16a of the respective phases of the alternating-current machine 16 are detected by a current sensor 14, a magnetic pole position of a rotor of the alternating-current machine 16 is detected by a rotation sensor 15. The control circuit 6 controls the inverter 100 using results of the detection by the current sensor 14 and the rotation sensor 15.

An operating voltage for the control circuit 6 (e.g., 5 [V], 3.3 [V], or 2.5 [V]) is generated based on direct current power supplied from a second direct-current power supply 12. The second direct-current power supply 12 is a direct-current power supply lower in power supply voltage than the first direct-current power supply 11. The power supply voltage of the second direct-current power supply 12 is, for example, 12 to 24 [V]. The first direct-current power supply 11 and the second direct-current power supply 12 are insulated from each other and have a floating relationship. Namely, a first ground G1 which is a ground of the first direct-current power supply 11 and a second ground G2 which is a ground of the second direct-current power supply 12 have an electrically floating relationship. Though depiction is omitted, a power supply circuit that supplies electric power (operating power) to the control circuit 6 includes, for example, a power supply input circuit connected to the second direct-current power supply 12; and a voltage regulator circuit that regulates a voltage inputted to the power supply input circuit from the second direct-current power supply 12. The power supply input circuit is formed using, for example, a noise filter, a smoothing capacitor, and a regulator circuit, and the voltage regulator circuit is formed using, for example, a regulator device.

A switching control signal SW generated by the control circuit 6 is inputted through a drive circuit 2 to a control terminal of a switching element 3 (in the example shown in FIG. 1, a gate terminal of an IGBT) which is a control target. Namely, the drive circuit 2 drives the switching element 3 based on the switching control signal SW. In the example shown in FIG. 1, the drive circuit 2 drives the switching element 3 by controlling a potential difference between two terminals, a gate terminal and an emitter terminal, of the switching element 3 (IGBT). As shown in FIG. 1, the drive circuits 2 are provided so as to correspond to the respective plurality of switching elements 3. Namely, the plurality of drive circuits 2 respectively drive their corresponding switching elements 3 among the plurality of switching elements 3. The plurality of drive circuits 2 include first drive circuits 21 that drive the first switching elements 31; and second drive circuits 22 that drive the second switching elements 32. The first drive circuits 21 drive the first switching elements 31 based on first switching control signals SW1. In addition, the second drive circuits 22 drive the second switching elements 32 based on second switching control signals SW2.

Each drive circuit 2 improves the driving capabilities (capabilities to allow a circuit at a subsequent stage to operate, e.g., voltage amplitude or output current) of a switching control signal SW generated by the control circuit 6, and supplies the switching control signal SW to the control terminal of a corresponding switching element 3. The drive circuits 2 each are formed using, for example, a push-pull circuit including two transistors connected in series with each other. The drive circuits 2 are circuits higher in operating voltage than the control circuit 6 that generates switching control signals SW. Hence, the control board 1 includes an insulating element (an insulating element for signal transmission) such as a photocoupler or a magnetic coupler, and the insulating element transmits a switching control signal SW generated by the control circuit 6 to a drive circuit 2 in an insulation state (in an electrically isolated state). In the present embodiment, as an element in which the drive circuit 2 is formed, an element in which the drive circuit 2 and the above-described insulating element are included in one package is used.

Electric power (operating power) is supplied to each of the drive circuits 2 from a power supply circuit 7. As in an example of the power supply circuit 7 shown in FIG. 2, the power supply circuit 7 supplies electric power to the drive circuits 2 using transformers 8. Specifically, the power supply circuit 7 supplies electric power to the first drive circuits 21 using first transformers 81, and supplies electric power to the second drive circuits 22 using second transformers 82. The power supply circuit 7 outputs lower-stage drive voltages VL which are supplied to the first drive circuits 21 and upper-stage drive voltages VH which are supplied to the second drive circuits 22. A potential difference between each of the upper-stage drive voltages VH and the lower-stage drive voltages VL is, for example, 15 to 20 [V]. In the present embodiment, the transformers 8 are parts heavier in weight than the drive circuits 2. In addition, in the present embodiment, the transformers 8 are parts larger in size than the drive circuits 2.

In the present embodiment, the power supply circuit 7 outputs three upper-stage drive voltages VH, a U-phase upper-stage drive voltage VHU, a V-phase upper-stage drive voltage VHV, and a W-phase upper-stage drive voltage VHW, and outputs three lower-stage drive voltages VL, a U-phase lower-stage drive voltage VLU, a V-phase lower-stage drive voltage VLV, and a W-phase lower-stage drive voltage VLW. The three upper-stage drive voltages VH each are an electrically isolated floating power supply and have different positive side potentials and different negative side potentials. On the other hand, the three lower-stage drive voltages VL have a common negative side potential (specifically, the potential of the first ground G1) and have, though not insulated from each other, different positive side potentials.

The U-phase lower-stage drive voltage VLU is supplied to a first drive circuit 21 that drives a first switching element 31 (the first switching element 31 for the U-phase) included in the U-phase arm 33U, and the U-phase upper-stage drive voltage VHU is supplied to a second drive circuit 22 that drives a second switching element 32 (the second switching element 32 for the U-phase) included in the U-phase arm 33U. The V-phase lower-stage drive voltage VLV is supplied to a first drive circuit 21 that drives a first switching element 31 (the first switching element 31 for the V-phase) included in the V-phase arm 33V, and the V-phase upper-stage drive voltage VHV is supplied to a second drive circuit 22 that drives a second switching element 32 (the second switching element 32 for the V-phase) included in the V-phase arm 33V. The W-phase lower-stage drive voltage VLW is supplied to a first drive circuit 21 that drives a first switching element 31 (the first switching element 31 for the W-phase) included in the W-phase arm 33W, and the W-phase upper-stage drive voltage VHW is supplied to a second drive circuit 22 that drives a second switching element 32 (the second switching element 32 for the W-phase) included in the W-phase arm 33W.

Figure 2:
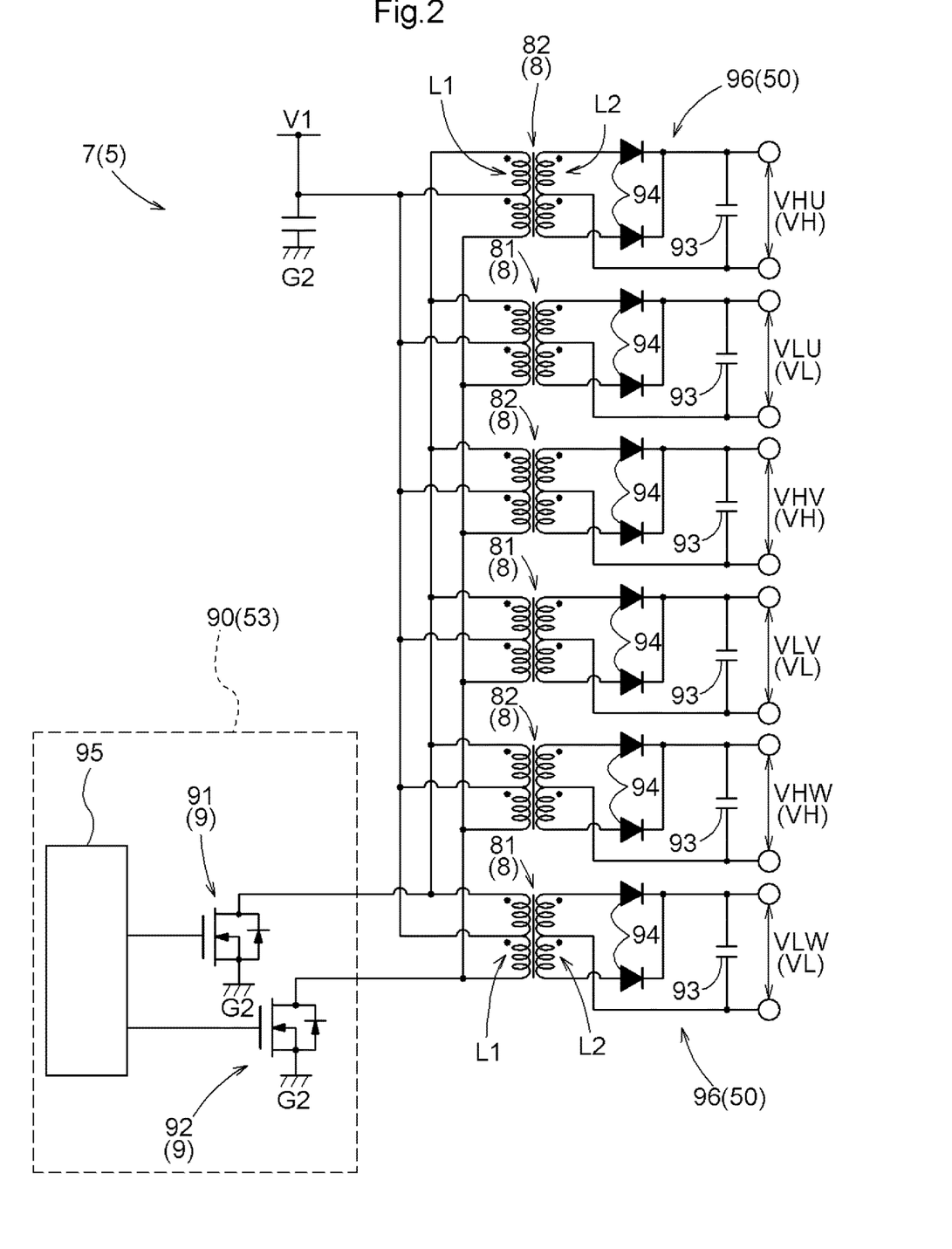
FIG. 2 is a diagram showing an exemplary configuration of a power supply circuit.

The power supply circuit 7 includes a power supply control circuit 90 that controls the transformers 8. As shown in FIG. 2, the power supply control circuit 90 includes driving switching elements 9 that are connected to primary coils L1 of the transformers 8 (specifically, primary coils L1 of the first transformers 81 and primary coils L1 of the second transformers 82) to control supply of electric power to the primary coils L1; and a control part 95 that performs switching control of the driving switching elements 9. In the example shown in FIG. 2, the power supply circuit 7 is a switching power supply circuit of a push-pull type, and the two driving switching elements 9, a first driving switching element 91 and a second driving switching element 92, are connected to the primary coils L1. The first driving switching element 91 and the second driving switching element 92 are complementarily subjected to switching control by the control part 95.

Although FIG. 2 exemplifies a configuration in which the driving switching elements 9 (here, a pair of the first driving switching element 91 and the second driving switching element 92) which are shared by the six transformers 8 (the three first transformers 81 and the three second transformers 82) is provided, a configuration may be adopted in which the transformers 8 are divided into a plurality of groups (e.g., groups each including two transformers 8) and driving switching elements 9 (e.g., a pair of a first driving switching element 91 and a second driving switching element 92) are provided for each of the plurality of groups. In addition, although here, as an example, the power supply circuit 7 is a switching power supply circuit of a push-pull type, the power supply circuit 7 may be a switching power supply circuit of a type other than the push-pull type, such as a half-bridge type, a full-bridge type, a single forward type, or a flyback type.

An input voltage V1 (primary side voltage) which is inputted to the primary coil L1 of each of the first transformers 81 and the primary coil L1 of each of the second transformers 82 is generated by a power supply circuit (a voltage regulator, etc.) from a power supply voltage of the second direct-current power supply 12. Hence, the input voltage V1 is stable, and in the power supply circuit 7, without performing feedback control, an output voltage (secondary side voltage) which is outputted from the secondary coil L2 of the first transformer 81 is determined by the transformation ratio of the first transformer 81, and an output voltage (secondary side voltage) which is outputted from the secondary coil L2 of the second transformer 82 is determined by the transformation ratio of the second transformer 82. The secondary side voltage (lower-stage drive voltage VL) of the first transformer 81 is supplied to a first drive circuit 21, and the secondary side voltage (upper-stage drive voltage VH) of the second transformer 82 is supplied to a second drive circuit 22. In the example shown in FIG. 2, an alternating current voltage generated in the secondary coil L2 is converted into a direct current voltage by a rectifier circuit 96 that includes diodes 94 for rectification and a capacitor 93 for smoothing, thereby generating a secondary side voltage.

Figure 3:
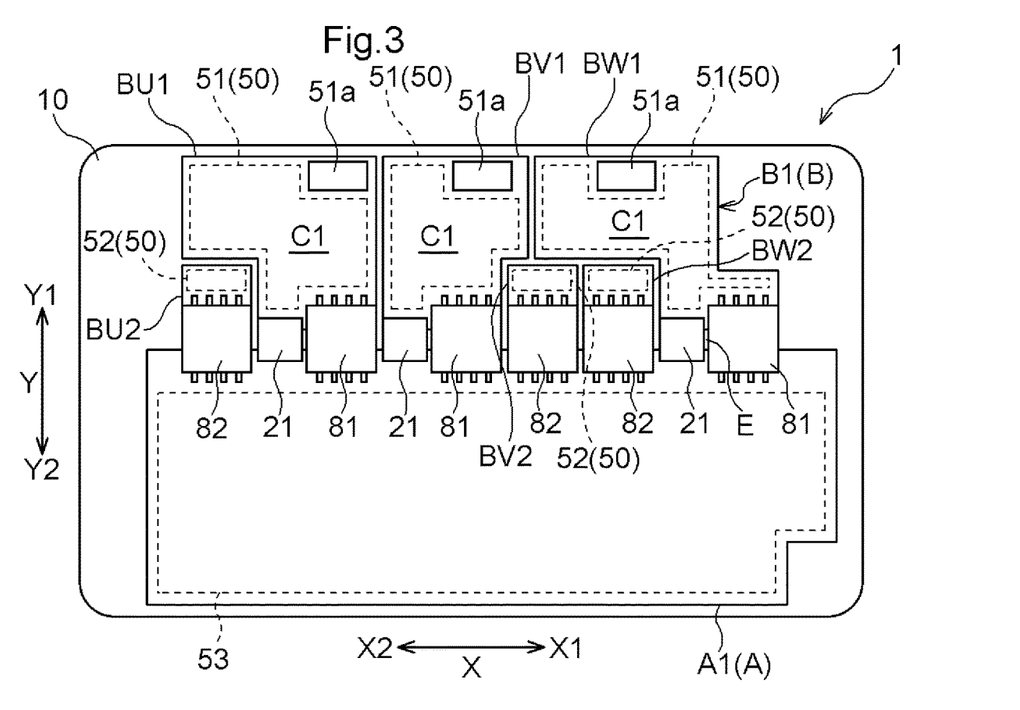
FIG. 3 is a plan view of the control board according to an embodiment.
Figure 6:
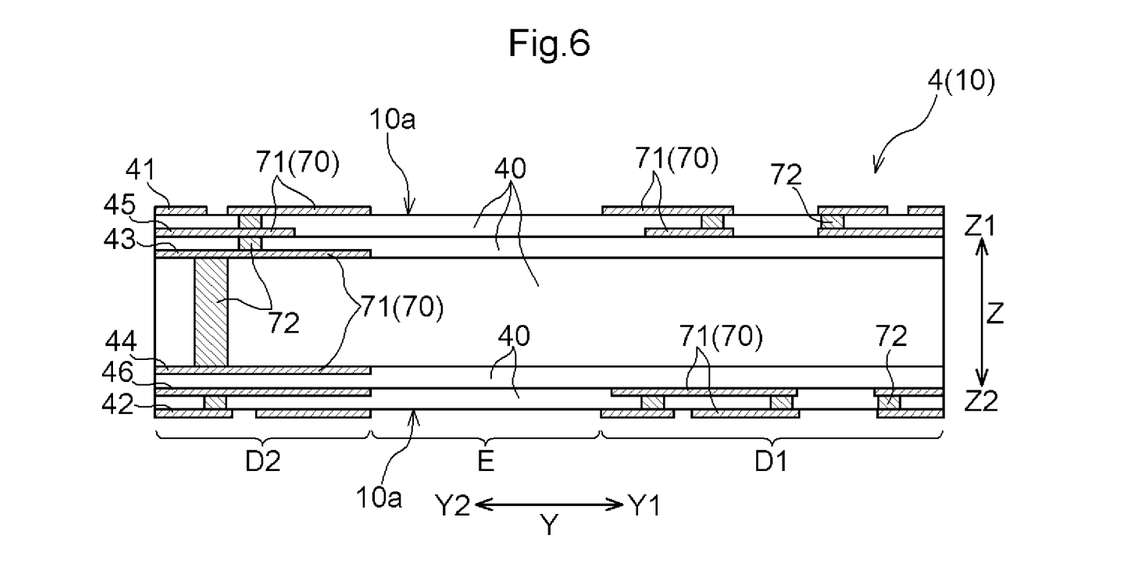
FIG. 6 is a cross-sectional view schematically showing a board main body part according to the embodiment.

Next, a configuration of the control board 1 will be described. As shown in FIGS. 3, 6, and 7, the control board 1 includes a plate-like board main body part 10. In the board main body part 10 there is formed a drive control circuit 5 for performing drive control of the inverter 100. The drive control circuit 5 includes a low voltage circuit 53 and high voltage circuits 50 having a high operating voltage compared to the low voltage circuit 53. The low voltage circuit 53 is insulated from the high voltage circuits 50. The high voltage circuits 50 include first high voltage circuits 51 connected to the first switching elements 31; and second high voltage circuits 52 connected to the second switching elements 32. Namely, the drive control circuit 5 includes the first high voltage circuits 51 which are high voltage circuits 50 and are connected to the first switching elements 31; and the second high voltage circuits 52 which are high voltage circuits 50 and are connected to the second switching elements 32. The drive control circuit 5 further includes first transformers 81 that supply drive voltages for the first switching elements 31 from the low voltage circuit 53 to the first high voltage circuits 51; and second transformers 82 that supply drive voltages for the second switching elements 32 from the low voltage circuit 53 to the second high voltage circuits 52. Namely, drive voltages for the first switching elements 31 are supplied from the low voltage circuit 53 to the first high voltage circuits 51 through the first transformers 81, and drive voltages for the second switching elements 32 are supplied from the low voltage circuit 53 to the second high voltage circuits 52 through the second transformers 82.

As shown in FIG. 3, in the present embodiment, the board main body part 10 is formed in rectangular shape (including a square shape and a rectangular shape with chamfered corner parts) having four side parts as viewed from top in a thickness direction Z of the board main body part 10. The four side parts include two first side parts parallel to each other and two second side parts parallel to each other (here, side parts shorter than the first side parts), and a direction going along the two first side parts is a first direction X and a direction going along the two second side parts is a second direction Y. In addition, one side in the thickness direction Z is a first side Z1, the other side in the thickness direction Z is a second side Z2, one side in the first direction X is a third side X1, the other side in the first direction X is a fourth side X2, one side in the second direction Y is a fifth side Y1, and the other side in the second direction Y is a sixth side Y2. The first direction X and the second direction Y both are directions going along a board surface of the board main body part 10 (i.e., directions orthogonal to the thickness direction Z). In addition, the first direction X and the second direction Y are directions orthogonal to each other.

As shown in FIG. 6, the board main body part 10 has a multilayer structure 4 with even-numbered layers including a first layer 41 and a second layer 42. In the present embodiment, the multilayer structure 4 further includes a third layer 43 and a fourth layer 44. Namely, the board main body part 10 is a multilayer board (multilayer printed board) with even-numbered layers. Here, the "even-numbered layers" indicates that the number of stacked wiring layers (conductor layers) is an even number. Namely, the multilayer structure 4 with even-numbered layers has a wiring structure with even-numbered layers. The wiring layers each are a layer where a wiring pattern 71 using conductor foil 70 (copper foil, etc.) is formed, and the even-numbered wiring layers included in the multilayer structure 4 are stacked on top of each other in the thickness direction Z with insulating layers 40 therebetween. Each of the first layer 41, the second layer 42, the third layer 43, and the fourth layer 44 is a wiring layer. In the present embodiment, the board main body part 10 has the multilayer structure 4 with six layers, and the multilayer structure 4 further includes a fifth layer 45 and a sixth layer 46. Each of the fifth layer 45 and the sixth layer 46 is a wiring layer. The insulating layers 40 are formed using, for example, prepreg.

As shown in FIG. 6, the first layer 41 is formed on a surface part 10a on the first side Z1 of the board main body part 10, and the second layer 42 is formed on a surface part 10a on the second side Z2 of the board main body part 10. The third layer 43 and the fourth layer 44 are two layers closest to a central portion in the thickness direction Z of the board main body part 10. The third layer 43 is disposed between the first layer 41 and the fourth layer 44. The fifth layer 45 is disposed between the first layer 41 and the third layer 43, and the sixth layer 46 is disposed between the second layer 42 and the fourth layer 44. Namely, the first layer 41, the fifth layer 45, the third layer 43, the fourth layer 44, the sixth layer 46, and the second layer 42 are stacked on top of each other in this order from the first side Z1. In the present embodiment, the first side Z1 corresponds to "one side in the thickness direction" and the second side Z2 corresponds to the "other side in the thickness direction".

In the multilayer structure 4 there are made vias 72 (e.g., filled vias) for electrically connecting different wiring layers (e.g., wiring layers adjacent to each other in the thickness direction Z). The vias 72 are made so as to penetrate through the insulating layers 40, and conductors (copper, etc.) are provided inside the vias 72. Such a multilayer structure 4 is formed using, for example, a build-up process. Though omitted in FIG. 6, a resist (a permanent resist or a solder resist) is stacked on the first side Z1 of the first layer 41, and by making opening parts in the resist so that the first layer 41 is exposed, pads for mounting parts such as the drive circuits 2 and the transformers 8 on the first layer 41 are formed. In addition, a resist is stacked on the second side Z2 of the second layer 42, and by making opening parts in the resist so that the second layer 42 is exposed, pads for mounting parts on the second layer 42 are formed.

Figure 4:
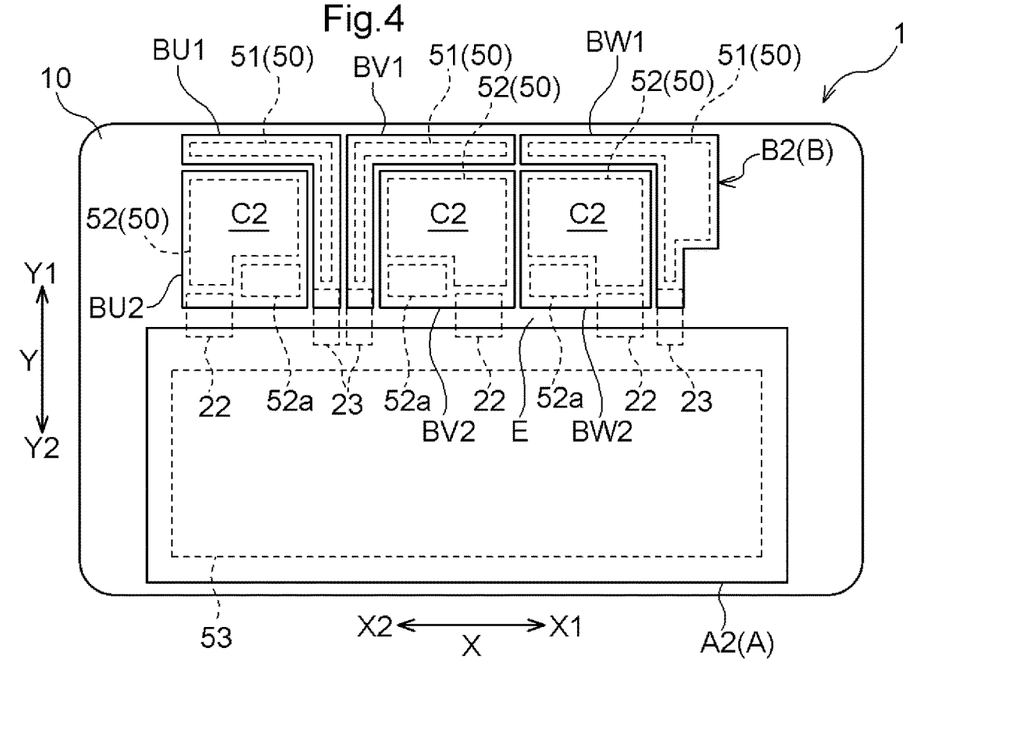
FIG. 4 is a perspective plan view of the control board according to the embodiment.

As shown in FIGS. 3 and 4, on both of the first layer 41 and the second layer 42 there are formed a low voltage region A in which the low voltage circuit 53 is disposed, a high voltage region B in which the high voltage circuits 50 are disposed, and an insulating region E in which the low voltage region A is electrically isolated from the high voltage region B. Here, the low voltage region A formed on the first layer 41 is a first-layer low voltage region A1, the low voltage region A formed on the second layer 42 is a second-layer low voltage region A2, the high voltage region B formed on the first layer 41 is a first-layer high voltage region B1, and the high voltage region B formed on the second layer 42 is a second-layer high voltage region B2. The low voltage regions A each include a circuit region that uses the second ground G2 as a reference potential, and the high voltage regions B each include a circuit region that uses the first ground G1 as a reference potential. The first drive circuits 21, the second drive circuits 22, the first transformers 81, and the second transformers 82 are disposed, straddling the insulating regions E to connect the low voltage regions A to the high voltage regions B.

FIG. 3 is a plan view of the board main body part 10 as viewed from the first side Z1, and FIG. 4 is a perspective plan view of the board main body part 10 as viewed from the first side Z1. FIG. 3 shows some parts (specifically, the first drive circuits 21, the first transformers 81, the second transformers 82, and first connecting parts 51a which will be described later) among parts disposed on the first side Z1 of the board main body part 10 (i.e., parts mounted on the first layer 41), and schematically shows in a simplified manner the first-layer low voltage region A1, the first-layer high voltage region B1, the low voltage circuit 53 disposed in the first-layer low voltage region A1, and the high voltage circuits 50 disposed in the first-layer high voltage region B1.

In addition, FIG. 4 shows some parts (specifically, the second drive circuits 22, signal transmission elements 23 which will be described later, and second connecting parts 52a which will be described later) among parts disposed on the second side Z2 of the board main body part 10 (i.e., parts mounted on the second layer 42), and schematically shows in a simplified manner the second-layer low voltage region A2, the second-layer high voltage region B2, the low voltage circuit 53 disposed in the second-layer low voltage region A2, and the high voltage circuits 50 disposed in the second-layer high voltage region B2.

Each of the first high voltage circuits 51 and the second high voltage circuits 52 includes a transformer 8 disposed, straddling the insulating region E to transmit electric power between the low voltage region A and the high voltage region B. Specifically, the first high voltage circuit 51 includes a first transformer 81 disposed, straddling the insulating region E to transmit electric power between the low voltage region A and the high voltage region B, and the second high voltage circuit 52 includes a second transformer 82 disposed, straddling the insulating region E to transmit electric power between the low voltage region A and the high voltage region B. Namely, each of the first transformer 81 and the second transformer 82 is disposed, straddling the insulating region E to transmit electric power between the low voltage region A and the high voltage region B. In the present embodiment, all transformers 8 (in other words, all of the first transformers 81 and the second transformers 82; here, three first transformers 81 and three second transformers 82) are disposed on the same side in the thickness direction Z of the board main body part 10 (specifically, the first side Z1 of the board main body part 10). Namely, all transformers 8 are disposed, straddling the insulating region E to connect the first-layer low voltage region A1 to the first-layer high voltage region B1.

In the present embodiment, all of the first transformers 81 and the second transformers 82 are disposed on the first side Z1 of the board main body part 10. Hence, of the first high voltage circuits 51 and the second high voltage circuits 52, at least the second high voltage circuits 52 need to be disposed separately in the first-layer high voltage region B1 and the second-layer high voltage region B2, but if only the second high voltage circuits 52 are disposed separately in the first-layer high voltage region B1 and the second-layer high voltage region B2, then an imbalance in the total area of the high voltage region B is likely to occur between the first side Z1 and second side Z2 of the board main body part 10. In this regard, in the present embodiment, as will be described later, not only the second high voltage circuits 52 but also the first high voltage circuits 51 are disposed separately in the first-layer high voltage region B1 and the second-layer high voltage region B2, and thus, even when, as described above, all of the first transformers 81 and the second transformers 82 are disposed on the first side Z1 of the board main body part 10, occurrence of a large imbalance in the total area of the high voltage region B between the first side Z1 and second side Z2 of the board main body part 10 is easily suppressed. As a result, miniaturization of the control board 1 as viewed from top is easily achieved.

Each of the first high voltage circuits 51 and the second high voltage circuits 52 includes a drive circuit disposed, straddling the insulating region E to transmit signals (a switching control signal SW, etc.) between the low voltage region A and the high voltage region B. Specifically, the first high voltage circuit 51 includes a first drive circuit 21 disposed, straddling the insulating region E to transmit signals (a first switching control signal SW1, etc.) between the low voltage region A and the high voltage region B, and the second high voltage circuit 52 includes a second drive circuit 22 disposed, straddling the insulating region E to transmit signals (a second switching control signal SW2, etc.) between the low voltage region A and the high voltage region B. In the present embodiment, the drive circuits 2 are disposed separately on both sides in the thickness direction Z of the board main body part 10. Specifically, all of the first drive circuits 21 (here, three first drive circuits 21) are disposed on the first side Z1 of the board main body part 10, and all of the second drive circuits 22 (here, three second drive circuits 22) are disposed on the second side Z2 of the board main body part 10. Namely, all of the first drive circuits 21 are disposed, straddling the insulating region E to connect the first-layer low voltage region A1 to the first-layer high voltage region B1, and all of the second drive circuits 22 are disposed, straddling the insulating region E to connect the second-layer low voltage region A2 to the second-layer high voltage region B2.

In the present embodiment, the low voltage circuit 53 disposed in the low voltage regions A includes the control circuit 6; a signal transmission circuit that transmits switching control signals SW to the drive circuits 2 from the control circuit 6; the power supply control circuit 90 included in the power supply circuit 7; and an electric power transmission circuit that transmits primary side voltages from the power supply control circuit 90 to the transformers 8 (specifically, the primary coils L1). The low voltage circuit 53 is disposed separately in the first-layer low voltage region A1 and the second-layer low voltage region A2. Here, disposition of a circuit separately in two regions (a first region and a second region) means that the circuit includes at least a portion disposed in the first region and a portion disposed in the second region, and the circuit may further include a portion disposed in another region. A portion of the low voltage circuit 53 disposed in the first-layer low voltage region A1 is formed using a wiring pattern 71 provided in the first layer 41, and a portion of the low voltage circuit 53 disposed in the second-layer low voltage region A2 is formed using a wiring pattern 71 provided in the second layer 42.

In the present embodiment, each of the first high voltage circuits 51 disposed in the high voltage regions B includes a signal transmission circuit that transmits a first switching control signal SW1 to a first connecting part 51*a* from a first drive circuit 21; and an electric power transmission circuit that transmits a secondary side voltage to the first drive circuit 21 from a first transformer 81 (specifically, a secondary coil L2). Here, the first connecting part 51*a* is a part of the first high voltage circuit 51 that is connected to a first switching element 31. The first switching control signal SW1 is transmitted from the first drive circuit 21 to the first switching element 31 through the first connecting part 51*a*. In the present embodiment, the first connecting part 51*a* is provided in the first-layer high voltage region B1. As shown in FIG. 7, in the present embodiment, the first connecting part 51*a* includes a connector to which a first flexible substrate 61 having flexibility is connected. The first high voltage circuit 51 is connected to the first switching element 31 through the first flexible substrate 61. Note that a configuration can also be adopted in which the first connecting part 51*a* includes, instead of a connector, a hole part that penetrates in the thickness direction Z through the board main body part 10, and a connection terminal of the first switching element 31 is connected to the first connecting part 51*a*, with the connection terminal disposed so as to pass through the hole part.

In the present embodiment, the first high voltage circuit 51 disposed in the high voltage regions B further includes a signal transmission circuit that transmits signals indicating results of detection by detection circuits (a current detection circuit, a temperature detection circuit, etc.) provided in the first switching element 31, from the first connecting part 51*a* to a signal transmission element 23. The signal transmission element 23 includes an insulating element (an insulating element for signal transmission) such as a photocoupler or a magnetic coupler. The signal transmission element 23 is disposed, straddling the insulating region E to connect the low voltage region A to the high voltage region B. The above-described signals indicating results of detection are transmitted from the high voltage region B to the low voltage region A through the signal transmission element 23, and inputted to the control circuit 6. In the present embodiment, all of the signal transmission elements 23 (here, three signal transmission elements 23) are disposed on the second side Z2 of the board main body part 10. Namely, all of the signal transmission elements 23 are disposed, straddling the insulating region E to connect the second-layer low voltage region A2 to the second-layer high voltage region B2.

At least a part of the first high voltage circuit 51 is disposed in the first-layer high voltage region B1. A portion of the first high voltage circuit 51 disposed in the first-layer high voltage region B1 is formed using the wiring pattern 71 provided in the first layer 41. In the present embodiment, the first high voltage circuit 51 is disposed separately in the first-layer high voltage region B1 and the second-layer high voltage region B2. A portion of the first high voltage circuit 51 disposed in the second-layer high voltage region B2 is formed using the wiring pattern 71 provided in the second layer 42. A portion of one first high voltage circuit 51 disposed in the first-layer high voltage region B1 and a portion of the one first high voltage circuit 51 disposed in the second-layer high voltage region B2 are disposed to have an overlapping portion as viewed from top. The portion of the one first high voltage circuit 51 disposed in the first-layer high voltage region B1 and the portion of the one first high voltage circuit 51 disposed in the second-layer high voltage region B2 are electrically connected to each other through vias 72.

In the present embodiment, each of the second high voltage circuits 52 disposed in the high voltage regions B includes a signal transmission circuit that transmits a second switching control signal SW2 to a second connecting part 52*a* from a second drive circuit 22; and an electric power transmission circuit that transmits a secondary side voltage to the second drive circuit 22 from a second transformer 82 (specifically, a secondary coil L2). Here, the second connecting part 52*a* is a part of the second high voltage circuit 52 that is connected to a second switching element 32. The second switching control signal SW2 is transmitted from the second drive circuit 22 to the second switching element 32 through the second connecting part 52*a*. In the present embodiment, the second connecting part 52*a* is provided in the second-layer high voltage region B2. As shown in FIG. 7, in the present embodiment, the second connecting part 52*a* includes a connector to which a second flexible substrate 62 having flexibility is connected. The second high voltage circuit 52 is connected to the second switching element 32 through the second flexible substrate 62. Note that a configuration can also be adopted in which the second connecting part 52*a* includes, instead of a connector, a hole part that penetrates in the thickness direction Z through the board main body part 10, and a connection terminal of the second switching element 32 is connected to the second connecting part 52a, with the connection terminal disposed so as to pass through the hole part.

At least a part of the second high voltage circuit 52 is disposed in the second-layer high voltage region B2. A portion of the second high voltage circuit 52 disposed in the second-layer high voltage region B2 is formed using the wiring pattern 71 provided in the second layer 42. In the present embodiment, the second high voltage circuit 52 is disposed separately in the first-layer high voltage region B1 and the second-layer high voltage region B2. A portion of the second high voltage circuit 52 disposed in the first-layer high voltage region B1 is formed using the wiring pattern 71 provided in the first layer 41. A portion of one second high voltage circuit 52 disposed in the first-layer high voltage region B1 and a portion of the one second high voltage circuit 52 disposed in the second-layer high voltage region B2 are disposed to have an overlapping portion as viewed from top. The portion of the one second high voltage circuit 52 disposed in the first-layer high voltage region B1 and the portion of the one second high voltage circuit 52 disposed in the second-layer high voltage region B2 are electrically connected to each other through vias 72.

Note that although in the present embodiment, as described above, as an element in which a drive circuit 2 is formed, an element in which the drive circuit 2 and an insulating element are included in one package is used, a configuration can also be adopted in which the drive circuit 2 and the insulating element are individual parts. In this case, the insulating element is disposed, straddling the insulating region E to connect the low voltage region A to the high voltage region B, and the drive circuit 2 is disposed in the high voltage region B. Namely, in this case, a high voltage circuit 50 disposed in the high voltage regions B also includes a drive circuit 2. Specifically, a first high voltage circuit 51 disposed in the high voltage regions B includes a first drive circuit 21, and a second high voltage circuit 52 disposed in the high voltage regions B includes a second drive circuit 22.

In the present embodiment, the inverter 100 includes three arms 33, the U-phase arm 33U, the V-phase arm 33V, and the W-phase arm 33W. Namely, the inverter 100 includes three first switching elements 31 and three second switching elements 32. Thus, the high voltage regions B each include a U-phase first high voltage region BU1 in which a first high voltage circuit 51 connected to a U-phase first switching element 31 (U-phase first high voltage circuit 51) is disposed; a U-phase second high voltage region BU2 in which a second high voltage circuit 52 connected to a U-phase second switching element 32 (U-phase second high voltage circuit 52) is disposed; a V-phase first high voltage region BV1 in which a first high voltage circuit 51 connected to a V-phase first switching element 31 (V-phase first high voltage circuit 51) is disposed; a V-phase second high voltage region BV2 in which a second high voltage circuit 52 connected to a V-phase second switching element 32 (V-phase second high voltage circuit 52) is disposed; a W-phase first high voltage region BW1 in which a first high voltage circuit 51 connected to a W-phase first switching element 31 (W-phase first high voltage circuit 51) is disposed; and a W-phase second high voltage region BW2 in which a second high voltage circuit 52 connected to a W-phase second switching element 32 (W-phase second high voltage circuit 52) is disposed.

In the present embodiment, each of the first high voltage circuits 51 and the second high voltage circuits 52 is disposed separately in the first-layer high voltage region B1 and the second-layer high voltage region B2. Hence, each of the U-phase first high voltage region BU1, the U-phase second high voltage region BU2, the V-phase first high voltage region BV1, the V-phase second high voltage region BV2, the W-phase first high voltage region BW1, and the W-phase second high voltage region BW2 includes a portion formed on the first layer 41 and a portion formed on the second layer 42. Namely, as shown in FIG. 3, the first-layer high voltage region B1 includes a part of the U-phase first high voltage region BU1, a part of the U-phase second high voltage region BU2, a part of the V-phase first high voltage region BV1, a part of the V-phase second high voltage region BV2, a part of the W-phase first high voltage region BW1, and a part of the W-phase second high voltage region BW2. In addition, as shown in FIG. 4, the second-layer high voltage region B2 includes another part of the U-phase first high voltage region BU1, another part of the U-phase second high voltage region BU2, another part of the V-phase first high voltage region BV1, another part of the V-phase second high voltage region BV2, another part of the W-phase first high voltage region BW1, and another part of the W-phase second high voltage region BW2.

As shown in FIGS. 3 and 4, in the present embodiment, the high voltage regions B are disposed on the fifth side Y1 of the low voltage regions A. Specifically, the first-layer high voltage region B1 is disposed on the fifth side Y1 of the first-layer low voltage region A1, and the second-layer high voltage region B2 is disposed on the fifth side Y1 of the second-layer low voltage region A2. The insulating regions E that electrically isolate the low voltage regions A from the high voltage regions B are formed so as to extend between the low voltage regions A and the high voltage regions B in the first direction X1. In the present embodiment, in a portion on an insulating region E side of the first-layer high voltage region B1 (here, a portion on the sixth side Y2) and a portion on an insulating region E side of the second-layer high voltage region B2 (here, a portion on the sixth side Y2), the U-phase second high voltage region BU2, the U-phase first high voltage region BU1, the V-phase first high voltage region BV1, the V-phase second high voltage region BV2, the W-phase second high voltage region BW2, and the W-phase first high voltage region BW1 are disposed in this order from the fourth side X2.

Figure 5:
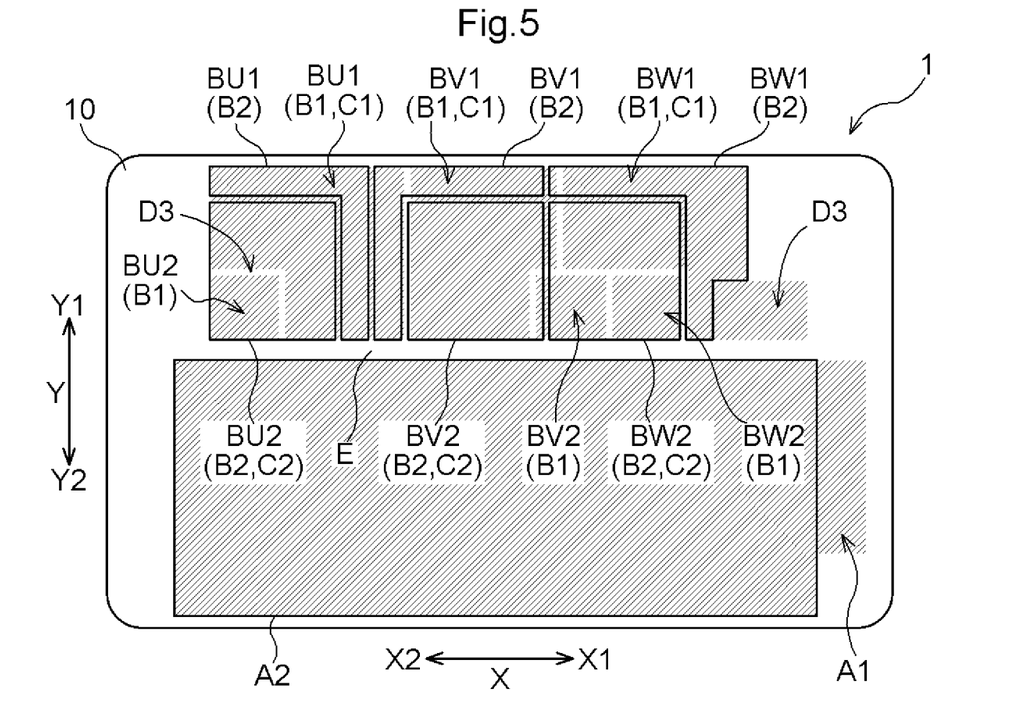
FIG. 5 is a perspective plan view of the control board according to the embodiment.

As shown in FIG. 5, in the present embodiment, the first-layer high voltage region B1 and the second-layer high voltage region B2 are disposed to have overlapping portions as viewed from top in the thickness direction Z. Note that in FIG. 5, the first-layer high voltage region B1 (specifically, a portion of each of the U-phase first high voltage region BU1, the U-phase second high voltage region BU2, the V-phase first high voltage region BV1, the V-phase second high voltage region BV2, the W-phase first high voltage region BW1, and the W-phase second high voltage region BW2 that is included in the first-layer high voltage region B1) is shown by hatching, and the second-layer high voltage region B2 (specifically, a portion of each of the U-phase first high voltage region BU1, the U-phase second high voltage region BU2, the V-phase first high voltage region BV1, the V-phase second high voltage region BV2, the W-phase first high voltage region BW1, and the W-phase second high voltage region BW2 that is included in the second-layer high voltage region B2) is shown by a solid enclosed box. In addition, as shown in FIG. 5, in the present embodiment, the first-layer low voltage region A1 and the second-layer low voltage region A2 are disposed to have an overlapping portion as viewed from top. Note that in FIG. 5, the first-layer low voltage region A1 is shown by hatching and the second-layer low voltage region A2 is shown by a solid enclosed box. In the present embodiment, the first-layer high voltage region B1 and the second-layer low voltage region A2 are disposed so as not to overlap each other as viewed from top, and the second-layer high voltage region B2 and the first-layer low voltage region A1 are disposed so as not to overlap each other as viewed from top.

Since the first-layer high voltage region B1 and the second-layer high voltage region B2 are thus disposed to have overlapping portions as viewed from top, securing of electrical isolation performance between the first-layer high voltage region B1 and the second-layer high voltage region B2 can be a problem. Particularly, securing of electrical isolation performance can be a problem in a region where a portion of the first-layer high voltage region B1 in which one of a first high voltage circuit 51 and a second high voltage circuit 52 is disposed and a portion of the second-layer high voltage region B2 in which the other one of the first high voltage circuit 51 and the second high voltage circuit 52 is disposed overlap each other as viewed from top (hereinafter, referred to as "first overlapping region") or a region where a portion of the first-layer high voltage region B1 in which a second high voltage circuit 52 is disposed and a portion of the second-layer high voltage region B2 in which another second high voltage circuit 52 is disposed overlap each other as viewed from top (hereinafter, referred to as "second overlapping region").

In an example shown in FIG. 5, as first overlapping regions, there are present at least a region where a portion of the U-phase first high voltage region BU1 formed on the first layer 41 and a portion of the U-phase second high voltage region BU2 formed on the second layer 42 overlap each other as viewed from top; a region where a portion of the V-phase first high voltage region BV1 formed on the first layer 41 and a portion of the V-phase second high voltage region BV2 formed on the second layer 42 overlap each other as viewed from top; and a region where a portion of the W-phase first high voltage region BW1 formed on the first layer 41 and a portion of the W-phase second high voltage region BW2 formed on the second layer 42 overlap each other as viewed from top. In addition, in the example shown in FIG. 5, as a second overlapping region, there is present at least a region where a portion of the V-phase second high voltage region BV2 formed on the first layer 41 and a portion of the W-phase second high voltage region BW2 formed on the second layer 42 overlap each other as viewed from top.

In the control board 1, by adopting a configuration described below, the problem of electrical isolation performance is avoided. Here, a region of the board main body part 10 that overlaps both of the first-layer high voltage region B1 and the second-layer high voltage region B2 as viewed from top is a high voltage overlapping region D1 (see FIG. 6). In addition, a region of the board main body part 10 that overlaps both of the first-layer low voltage region A1 and the second-layer low voltage region A2 as viewed from top is a low voltage overlapping region D2 (see FIG. 6). As shown in FIG. 6, in the low voltage overlapping region D2, a wiring pattern 71 is provided in each of the first layer 41, the second layer 42, the third layer 43, and the fourth layer 44. In the present embodiment, in the low voltage overlapping region D2, a wiring pattern 71 is provided in each of the first layer 41, the second layer 42, the third layer 43, the fourth layer 44, the fifth layer 45, and the sixth layer 46. Namely, in the low voltage overlapping region D2, the wiring patterns 71 are provided in all layers (wiring layers) included in the multilayer structure 4.

On the other hand, in the high voltage overlapping region D1, wiring patterns 71 are provided in the first layer 41 and the second layer 42, and wiring patterns 71 are not provided in the third layer 43 and the fourth layer 44 closest to the central portion in the thickness direction Z. As such, in the high voltage overlapping region D1, by providing layers with no wiring patterns 71, electrical isolation performance between the first-layer high voltage region B1 and the second-layer high voltage region B2 is easily and appropriately secured. Note that in the present embodiment, in the high voltage overlapping region D1, the wiring patterns 71 are provided in the first layer 41, the second layer 42, the fifth layer 45, and the sixth layer 46. In the present embodiment, an insulating layer 40 (e.g., a core insulating layer) disposed between the third layer 43 and the fourth layer 44 is formed to be larger in thickness (width in the thickness direction Z) than the other insulating layers 40, which also facilitates securing of electrical isolation performance between the first-layer high voltage region B1 and the second-layer high voltage region B2. In addition, in the high voltage overlapping region D1, by providing layers with no wiring patterns 71, coupling capacitance between the first-layer high voltage region B1 and the second-layer high voltage region B2 is suppressed to a small level, by which noise caused by capacitive coupling is easily reduced.

Though details are omitted, in the present embodiment, each wiring pattern 71 is formed such that in a portion in which wiring patterns 71 provided in adjacent wiring layers overlap each other as viewed from top, the wiring patterns 71 are orthogonal to each other as viewed from top. By this, coupling capacitance between the adjacent wiring layers can be suppressed to a small level. Note that in the high voltage overlapping region D1, wiring patterns 71 are not provided in the third layer 43 and the fourth layer 44, and thus, in the high voltage overlapping region D1, wiring layers adjacent to the fifth layer 45 are the first layer 41 and the sixth layer 46, and wiring layers adjacent to the sixth layer 46 are the second layer 42 and the fifth layer 45.

A configuration can be adopted in which when there is a region that overlaps only one of the first-layer high voltage region B1 and the second-layer high voltage region B2 as viewed from top, in the region, wiring patterns 71 are not provided in the third layer 43 and the fourth layer 44. Particularly, when the region that overlaps only one of the first-layer high voltage region B1 and the second-layer high voltage region B2 as viewed from top is a region that overlaps both of the high voltage region B and the low voltage region A as viewed from top, in terms of securing electrical isolation performance, it is preferred to adopt a configuration in which wiring patterns 71 are not provided in the third layer 43 and the fourth layer 44.

Here, a region of the board main body part 10 that overlaps only one of the first-layer high voltage region B1 and the second-layer high voltage region B2 as viewed from top is a target region D3 (see FIG. 5). In the example shown in FIG. 5, as target regions D3, there are present a region that overlaps only the first-layer high voltage region B1 as viewed from top; and a region that overlaps only the second-layer high voltage region B2 as viewed from top. Though depiction is omitted, in the present embodiment, a wiring pattern 71 that connects a portion of a high voltage circuit 50 disposed in the first-layer high voltage region B1 to a portion of the high voltage circuit 50 disposed in the second-layer high voltage region B2 is provided in an intermediate layer which is a layer between the first layer 41 and the second layer 42 (in the present embodiment, at least any one of the third layer 43, the fourth layer 44, the fifth layer 45, and the sixth layer 46) in a target region D3. In the present embodiment, each of the first high voltage circuits 51 and the second high voltage circuits 52 is disposed separately in the first-layer high voltage region B1 and the second-layer high voltage region B2. Hence, a wiring pattern 71 for connecting a portion of a first high voltage circuit 51 disposed in the first-layer high voltage region B1 to a portion of the first high voltage circuit 51 disposed in the second-layer high voltage region B2 is provided in an intermediate layer in a target region D3, and a wiring pattern 71 for connecting a portion of a second high voltage circuit 52 disposed in the first-layer high voltage region B1 to a portion of the second high voltage circuit 52 disposed in the second-layer high voltage region B2 is provided in an intermediate layer in a target region D3.

In the present embodiment, wiring patterns 71 (power supply patterns) connected to power supplies and wiring patterns 71 (ground patterns) connected to grounds are provided in the fifth layer 45 and the sixth layer 46. Hence, in the high voltage overlapping region D1, wiring patterns 71 (signal patterns) that transmit signals are mainly provided in the first layer 41 and the second layer 42. In the present embodiment, signal patterns are also provided in the fifth layer 45 and the sixth layer 46. Note that the power supply patterns are, for example, a wiring pattern 71 connected to a positive side of the second direct-current power supply 12 and a wiring pattern 71 connected to a positive side of a power supply (upper-stage drive voltages VH and lower-stage drive voltages VL) generated by the power supply circuit 7. In addition, the ground patterns are, for example, a wiring pattern 71 connected to the first ground G1 and a wiring pattern 71 connected to the second ground G2.

In many cases, the power supply patterns which are wiring patterns 71 connected to the power supplies and the ground patterns which are wiring patterns 71 connected to the grounds are provided to be thick or widely compared to the signal patterns which are wiring patterns 71 that transmit signals. Hence, the power supply patterns and the ground patterns generally have high noise immunity and high shielding function compared to the signal patterns. In the present embodiment, since the power supply patterns and the ground patterns that have such properties are disposed between the first layer 41 and the second layer 42 (specifically, the fifth layer 45 and the sixth layer 46), noise propagation between the first-layer high voltage region B1 and the second-layer high voltage region B2 in the high voltage overlapping region D1 is easily suppressed.

With a portion of the high voltage region B in which a first connecting part 51a is disposed being a first connecting region C1 and a portion of the high voltage region B in which a second connecting part 52a is disposed being a second connecting region C2, in the present embodiment, at least a part of the first connecting region C1 is included in the first-layer high voltage region B1, and at least a part of the second connecting region C2 is included in the second-layer high voltage region B2. In the present embodiment, the first connecting part 51a is a connector mounted on the first layer 41, and the second connecting part 52a is a connector mounted on the second layer 42. Hence, in the present embodiment, the entire first connecting region C1 is included in the first-layer high voltage region B1, and the entire second connecting region C2 is included in the second-layer high voltage region B2.

In the present embodiment, a first connecting region C1 and a second connecting region C2 that are connected to the first switching element 31 and second switching element 32 included in one arm 33 are disposed to have an overlapping portion as viewed from top. By thus disposing the first connecting region C1 and the second connecting region C2, a pair of a first connecting part 51a and a second connecting part 52a that are connected to the first switching element 31 and second switching element 32 included in the one arm 33 can be disposed on the control board 1 such that the first connecting part 51a and the second connecting part 52a are arranged in the same order as the arrangement order of the first switching element 31 and the second switching element 32 in the inverter 100. Thus, connection between the control board 1 and the inverter 100 is facilitated.

Specifically, a first connecting region C1 connected to the U-phase first switching element 31 and a second connecting region C2 connected to the U-phase second switching element 32 are disposed to have an overlapping portion as viewed from top. Here, the first connecting region C1 connected to the U-phase first switching element 31 corresponds to a portion of the U-phase first high voltage region BU1 formed on the first layer 41 (see FIG. 3), and the second connecting region C2 connected to the U-phase second switching element 32 corresponds to a portion of the U-phase second high voltage region BU2 formed on the second layer 42 (see FIG. 4).

In addition, a first connecting region C1 connected to the V-phase first switching element 31 and a second connecting region C2 connected to the V-phase second switching element 32 are disposed to have an overlapping portion as viewed from top. Here, the first connecting region C1 connected to the V-phase first switching element 31 corresponds to a portion of the V-phase first high voltage region BV1 formed on the first layer 41 (see FIG. 3), and the second connecting region C2 connected to the V-phase second switching element 32 corresponds to a portion of the V-phase second high voltage region BV2 formed on the second layer 42 (see FIG. 4).

In addition, a first connecting region C1 connected to the W-phase first switching element 31 and a second connecting region C2 connected to the W-phase second switching element 32 are disposed to have an overlapping portion as viewed from top. Here, the first connecting region C1 connected to the W-phase first switching element 31 corresponds to a portion of the W-phase first high voltage region BW1 formed on the first layer 41 (see FIG. 3), and the second connecting region C2 connected to the W-phase second switching element 32 corresponds to a portion of the W-phase second high voltage region BW2 formed on the second layer 42 (see FIG. 4).

As shown in FIGS. 3 and 4, in the present embodiment, a second connecting part 52a connected to the U-phase second switching element 32, a first connecting part 51a connected to the U-phase first switching element 31, a second connecting part 52a connected to the V-phase second switching element 32, a first connecting part 51a connected to the V-phase first switching element 31, a second connecting part 52a connected to the W-phase second switching element 32, and a first connecting part 51a connected to the W-phase first switching element 31 are disposed in this order from the fourth side X2.

Other Embodiments

Next, other embodiments of a control board will be described.

(1) The above-described embodiment describes, as an example, a configuration in which layers in which wiring patterns 71 are not provided in the high voltage overlapping region D1 are only the third layer 43 and the fourth layer 44 closest to the central portion in the thickness direction Z. However, the present disclosure is not limited to such a configuration, and a configuration can also be adopted in which in the high voltage overlapping region D1, wiring patterns 71 are not provided in layers adjacent to the third layer 43 and the fourth layer 44, either (note, however, that the first layer 41 and the second layer 42 are excluded), in addition to the third layer 43 and the fourth layer 44. For example, in the control board 1 of the above-described embodiment, a configuration can be adopted in which in the high voltage overlapping region D1, wiring patterns 71 are not provided in the third layer 43, the fourth layer 44, the fifth layer 45, and the sixth layer 46.

(2) The above-described embodiment describes, as an example, a configuration in which the board main body part 10 has the multilayer structure 4 with six layers. However, the present disclosure is not limited to such a configuration, and the number of layers of the multilayer structure 4 can be changed as appropriate. For example, a configuration in which the board main body part 10 has a multilayer structure 4 with four layers (i.e., a configuration in which the fifth layer 45 and the sixth layer 46 are not provided) or a configuration in which the board main body part 10 has a multilayer structure 4 with even-numbered layers including eight or more layers can also be adopted. In the latter case, two or more layers including the fifth layer 45 are disposed between the first layer 41 and the third layer 43, and two or more layers including the sixth layer 46 are disposed between the second layer 42 and the fourth layer 44.

(3) The above-described embodiment describes, as an example, a configuration in which the wiring patterns 71 connected to the power supplies and the wiring patterns 71 connected to the grounds are provided in the fifth layer 45 and the sixth layer 46. However, the present disclosure is not limited to such a configuration, and a configuration can also be adopted in which the wiring patterns 71 connected to the power supplies and the wiring patterns 71 connected to the grounds are provided in other layers, in addition to the fifth layer 45 and the sixth layer 46 or instead of the fifth layer 45 and the sixth layer 46.

(4) The above-described embodiment describes, as an example, a configuration in which a first connecting region C1 and a second connecting region C2 that are connected to the first switching element 31 and second switching element 32 included in one arm 33 are disposed to have an overlapping portion as viewed from top. However, the present disclosure is not limited to such a configuration, and for example, a configuration can also be adopted in which a first connecting region C1 connected to a first switching element 31 included in one arm 33 and a second connecting region C2 connected to a second switching element 32 included in another arm 33 are disposed to have an overlapping portion as viewed from top.

(5) The above-described embodiment describes, as an example, a configuration in which all transformers 8 (in the above-described embodiment, six transformers 8) are disposed on the first side Z1 of the board main body part 10. However, the present disclosure is not limited to such a configuration, and a configuration can also be adopted in which all transformers 8 are disposed on the second side Z2 of the board main body part 10. In addition, instead of a configuration in which all transformers 8 are disposed on the same side in the thickness direction Z of the board main body part 10, a configuration can also be adopted in which the transformers 8 are disposed separately on the first side Z1 and the second side Z2 of the board main body part 10. For example, a configuration can be adopted in which all of the first transformers 81 are disposed on the first side Z1 of the board main body part 10, and all of the second transformers 82 are disposed on the second side Z2 of the board main body part 10.

(6) The above-described embodiment describes, as an example, a configuration in which each of the first high voltage circuits 51 and the second high voltage circuits 52 is disposed separately in the first-layer high voltage region B1 and the second-layer high voltage region B2. Namely, in the above-described embodiment, both of the first high voltage circuits 51 and the second high voltage circuits 52 correspond to "target high voltage circuits". However, the present disclosure is not limited to such a configuration, and a configuration can also be adopted in which only either one of the first high voltage circuits 51 and the second high voltage circuits 52 is disposed separately in the first-layer high voltage region B1 and the second-layer high voltage region B2. For example, in the above-described embodiment, a configuration can be adopted in which only the second high voltage circuits 52 are disposed separately in the first-layer high voltage region B1 and the second-layer high voltage region B2. In this case, the second high voltage circuits 52 correspond to "target high voltage circuits". In addition, a configuration can also be adopted in which when the transformers 8 are disposed separately on the first side Z1 and the second side Z2 of the board main body part 10 (specifically, the first transformers 81 are disposed on the first side Z1 of the board main body part 10 and the second transformers 82 are disposed on the second side Z2 of the board main body part 10), both of the first high voltage circuits 51 and the second high voltage circuits 52 are not disposed separately in the first-layer high voltage region B1 and the second-layer high voltage region B2.

(7) The above-described embodiment describes, as an example, a configuration in which the first-layer high voltage region B1 and the second-layer high voltage region B2 are disposed to have overlapping portions as viewed from top, and the first-layer low voltage region A1 and the second-layer low voltage region A2 are disposed to have an overlapping portion as viewed from top. However, the present disclosure is not limited to such a configuration, and a configuration in which the first-layer high voltage region B1 and the second-layer high voltage region B2 are disposed to have no overlapping portions as viewed from top, a configuration in which the first-layer low voltage region A1 and the second-layer low voltage region A2 are disposed to have no overlapping portions as viewed from top, or a configuration in which those configurations are combined together can also be adopted.

(8) Note that a configuration disclosed in each of the above-described embodiments can also be applied in combination with a configuration disclosed in other embodiments (including a combination of embodiments which are described as other embodiments) as long as a contradiction does not arise. For other configurations, too, the embodiments disclosed in this specification are in all respects merely illustrative. Thus, various modifications can be made as appropriate without departing from the spirit and scope of the present disclosure.

Summary of the Embodiments

A summary of a control board described above will be described below.

A control board (1) whose control target is an inverter (100) including a first switching element (31) and a second switching element (32) includes a plate-like board main body part (10) in which a drive control circuit (5) for performing drive control of the inverter (100) is formed, and the drive control circuit (5) includes a low voltage circuit (53); a first high voltage circuit (51) which is a high voltage circuit (50) having a high operating voltage compared to the low voltage circuit (53) and which is connected to the first switching element (31); a second high voltage circuit (52) which is the high voltage circuit (50) and which is connected to the second switching element (32); a first transformer (81) that supplies a drive voltage for the first switching element (31) from the low voltage circuit (53) to the first high voltage circuit (51); and a second transformer (82) that supplies a drive voltage for the second switching element (32) from the low voltage circuit (53) to the second high voltage circuit (52), the board main body part (10) has a multilayer structure (4) with even-numbered layers including a first layer (41) formed on a surface part (10*a*) on one side (Z1) in a thickness direction (Z) of the board main body part (10), and a second layer (42) formed on a surface part (10*a*) on the other side (Z2) in the thickness direction (Z), on both of the first layer (41) and the second layer (42), a low voltage region (A) in which the low voltage circuit (53) is disposed, a high voltage region (B) in which the high voltage circuits (50) are disposed, and an insulating region (E) in which the low voltage region (A) is electrically isolated from the high voltage region (B) are formed, at least a part of the first high voltage circuit (51) is disposed in a first-layer high voltage region (B1) which is the high voltage region (B) formed on the first layer (41), and at least a part of the second high voltage circuit (52) is disposed in a second-layer high voltage region (B2) which is the high voltage region (B) formed on the second layer (42).

According to this configuration, at least a part of the first high voltage circuit (51) and at least a part of the second high voltage circuit (52) can be disposed separately in the first-layer high voltage region (B1) and the second-layer high voltage region (B2) which are formed on the opposite surface parts (10*a*) of the board main body part (10), and thus, it becomes easy to dispose the parts and wiring included in the first high voltage circuit (51) and the parts and wiring included in the second high voltage circuit (52) close to each other as viewed from top, or dispose them such that they overlap each other as viewed from top. As a result, a high degree of flexibility in disposition of parts and wiring is secured, by which miniaturization of the control board (1) as viewed from top can be achieved.

Here, it is preferred that the first-layer high voltage region (B1) and the second-layer high voltage region (B2) be disposed to have an overlapping portion as viewed from top in the thickness direction (Z).

According to this configuration, it becomes easy to secure a high degree of flexibility in disposition of parts and wiring, by which further miniaturization of the control board (1) as viewed from top can be achieved.

In a configuration in which, as described above, the first-layer high voltage region (B1) and the second-layer high voltage region (B2) are disposed to have an overlapping portion as viewed from top, it is preferred that the multilayer structure (4) include a third layer (43) and a fourth layer (44) which are two layers closest to a central portion in the thickness direction (Z), a first-layer low voltage region (A1) which is the low voltage region (A) formed on the first layer (41) and a second-layer low voltage region (A2) which is the low voltage region (A) formed on the second layer (42) be disposed to have an overlapping portion as viewed from top, and with a region of the board main body part (10) that overlaps both of the first-layer high voltage region (B1) and the second-layer high voltage region (B2) as viewed from top being a high voltage overlapping region (D1), and a region of the board main body part (10) that overlaps both of the first-layer low voltage region (A1) and the second-layer low voltage region (A2) as viewed from top being a low voltage overlapping region (D2), in the low voltage overlapping region (D2), a wiring pattern (71) using conductor foil (70) be provided in each of the first layer (41), the second layer (42), the third layer (43), and the fourth layer (44), and in the high voltage overlapping region (D1), the wiring pattern (71) be provided in the first layer (41) and the second layer (42), and the wiring pattern (71) not be provided in the third layer (43) and the fourth layer (44).

Since the first-layer high voltage region (B1) and the second-layer high voltage region (B2) are high voltage regions (B) in which the high voltage circuits (50) having a high operating voltage compared to the low voltage circuit (53) are disposed, when, as described above, the first-layer high voltage region (B1) and the second-layer high voltage region (B2) are disposed to have an overlapping portion as viewed from top, it commonly becomes difficult to secure electrical isolation performance between the first-layer high voltage region (B1) and the second-layer high voltage region (B2).

In this regard, in this configuration, in the low voltage overlapping region (D2) of the board main body part (10) that overlaps both of the first-layer low voltage region (A1) and the second-layer low voltage region (A2) as viewed from top, the wiring pattern (71) is provided in each of the first layer (41), the second layer (42), the third layer (43), and the fourth layer (44), whereas in the high voltage overlapping region (D1) of the board main body part (10) that overlaps both of the first-layer high voltage region (B1) and the second-layer high voltage region (B2) as viewed from top, the wiring patterns (71) are provided in the first layer (41) and the second layer (42) and wiring patterns (71) are not provided in the third layer (43) and the fourth layer (44) closest to the central portion in the thickness direction (Z). Hence, in the low voltage overlapping region (D2), a circuit is formed using all of the first layer (41), the second layer (42), the third layer (43), and the fourth layer (44), by which miniaturization of the control board (1) as viewed from top is achieved, whereas in the high voltage overlapping region (D1), layers with no wiring patterns (71) are provided, by which electrical isolation performance between the first-layer high voltage region (B1) and the second-layer high voltage region (B2) is easily and appropriately secured. In addition, coupling capacitance between the first-layer high voltage region (B1) and the second-layer high voltage region (B2) is suppressed to a small level, by which noise caused by capacitive coupling is easily reduced. Hence, the first-layer high voltage region (B1) and the second-layer high voltage region (B2) can be disposed to have an overlapping portion as viewed from top, while avoiding problems of electrical isolation performance and noise.

In addition, it is preferred that each of the first transformer (81) and the second transformer (82) be disposed, straddling a corresponding one of the insulating regions (E) to transmit electric power between a corresponding one of the low voltage regions (A) and a corresponding one of the high voltage regions (B), and all of the first transformer (81) and the second transformer (82) be disposed on the same side in the thickness direction (Z) of the board main body part (10).

According to this configuration, all of the first transformer (81) and the second transformer (82) which are generally said to be heavy parts compared to other parts can be disposed on the same side in the thickness direction (Z) of the board main body part (10). Thus, a process of mounting the first transformer (81) and the second transformer (82) on the board main body part (10) can be performed with all of the first transformer (81) and the second transformer (82) being supported by the board main body part (10) from below. Therefore, compared to a case in which the first transformer (81) and the second transformer (82) are disposed separately on both sides in the thickness direction (Z) of the board main body part (10), a process of mounting the first transformer (81) and the second transformer (82) on the board main body part (10) can be simplified.

In a configuration in which, as described above, all of the first transformer (81) and the second transformer (82) are disposed on the same side in the thickness direction (Z) of the board main body part (10), it is preferred that a target high voltage circuit which is at least one of the first high voltage circuit (51) and the second high voltage circuit (52) be disposed separately in the first-layer high voltage region (B1) and the second-layer high voltage region (B2), and with a region of the board main body part (10) that overlaps only one of the first-layer high voltage region (B1) and the second-layer high voltage region (B2) as viewed from top in the thickness direction (Z) being a target region (D3), a wiring pattern (71) using conductor foil (70) that connects a portion of the target high voltage circuit disposed in the first-layer high voltage region (B1) to a portion of the target high voltage circuit disposed in the second-layer high voltage region (B2) be provided in a layer between the first layer (41) and the second layer (42) of the multilayer structure (4) in the target region (D3).

When, as described above, all of the first transformer (81) and the second transformer (82) are disposed on the same side in the thickness direction (Z) of the board main body part (10), a target high voltage circuit which is at least one of the first high voltage circuit (51) and the second high voltage circuit (52) needs to be disposed separately in the first-layer high voltage region (B1) and the second-layer high voltage region (B2). According to this configuration, a portion of a target high voltage circuit disposed in the first-layer high voltage region (B1) and a portion of the target high voltage circuit disposed in the second-layer high voltage region (B2) can be appropriately connected to each other by a wiring pattern (71) provided in a layer between the first layer (41) and the second layer (42) in the target region (D3).

The control board according to the present disclosure can provide at least one of the above-described advantageous effects.

REFERENCE SIGNS LIST

1: Control board, 4: Multilayer structure, 5: Drive control circuit, 10: Board main body part, 10*a*: Surface part, 31: First switching element, 32: Second switching element, 41: First layer, 42: Second layer, 3: Third layer, 44: Fourth layer, 50: High voltage circuit, 51: First high voltage circuit, 52: Second high voltage circuit, 53: Low voltage circuit, 70: Conductor foil, 71: Wiring pattern, 81: First transformer, 82: Second transformer, 100: Inverter, A: Low voltage region, A1: First-layer low voltage region, A2: Second-layer low voltage region, B: High voltage region, B1: First-layer high voltage region, B2: Second-layer high voltage region, D1: High voltage overlapping region, D2: Low voltage overlapping region, D3: Target region, E: Insulating region, Z: Thickness direction, Z1: First side (one side in the thickness direction), and Z2: Second side (other side in the thickness direction)

The invention claimed is:

1. A control board for controlling an inverter including a first switching element and a second switching element, the control board comprising:
a plate-like board main body part in which a drive control circuit for performing drive control of the inverter is formed,
wherein
the drive control circuit includes:
a low voltage circuit;
a first high voltage circuit connected to the first switching element, the first high voltage circuit being a high voltage circuit having a high operating voltage compared to the low voltage circuit;
a second high voltage circuit connected to the second switching element, the second high voltage circuit being the high voltage circuit;
a first transformer that supplies a drive voltage for the first switching element from the low voltage circuit to the first high voltage circuit; and
a second transformer that supplies a drive voltage for the second switching element from the low voltage circuit to the second high voltage circuit,
the board main body part has a multilayer structure with an even-number of layers including a first layer formed on a surface part on one side in a thickness direction of the board main body part, and a second layer formed on a surface part on an other side in the thickness direction,
on both of the first layer and the second layer, a low voltage region in which the low voltage circuit is disposed, a high voltage region in which the high voltage circuits are disposed, and an insulating region in which the low voltage region is electrically isolated from the high voltage region are formed,
at least a part of the first high voltage circuit is disposed in a first-layer high voltage region, the first-layer high voltage region being the high voltage region formed on the first layer,
at least a part of the second high voltage circuit is disposed in a second-layer high voltage region, the second-layer high voltage region being the high voltage region formed on the second layer;
wherein the first-layer high voltage region and the second-layer high voltage region are disposed to have an overlapping portion as viewed from top in the thickness direction;
wherein
the multilayer structure includes a third layer and a fourth layer, the third layer and the fourth layer being two layers closest to a central portion in the thickness direction,
a first-layer low voltage region and a second-layer low voltage region are disposed to have an overlapping portion as viewed from top, the first-layer low voltage region being the low voltage region formed on the first layer, and the second-layer low voltage region being the low voltage region formed on the second layer, and
with a region of the board main body part that overlaps both of the first-layer high voltage region and the second-layer high voltage region as viewed from top being a high voltage overlapping region, and a region of the board main body part that overlaps both of the first-layer low voltage region and the second-layer low voltage region as viewed from top being a low voltage overlapping region, in the low voltage overlapping region, a wiring pattern using conductor foil is provided in each of the first layer, the second layer, the third layer, and the fourth layer, and in the high voltage overlapping region, the wiring pattern is provided in the first layer and the second layer, and the wiring pattern is not provided in the third layer and the fourth layer.

2. The control board according to claim 1, wherein each of the first transformer and the second transformer is disposed, straddling a corresponding one of the insulating regions to transmit electric power between a corresponding one of the low voltage regions and a corresponding one of the high voltage regions, and all of the first transformer and the second transformer are disposed on a same side in the thickness direction of the board main body part.

3. The control board according to claim 2, wherein a target high voltage circuit is disposed separately in the first-layer high voltage region and the second-layer high voltage region, the target high voltage circuit being at least one of the first high voltage circuit and the second high voltage circuit, with a region of the board main body part that overlaps only one of the first-layer high voltage region and the second-layer high voltage region as viewed from top in the thickness direction being a target region, and a second wiring pattern using conductor foil that connects a portion of the target high voltage circuit disposed in the first-layer high voltage region to a portion of the target high voltage circuit disposed in the second-layer high voltage region is provided in a layer between the first layer and the second layer of the multilayer structure in the target region.

* * * * *